(12) United States Patent
Asai et al.

(10) Patent No.: US 10,243,198 B2
(45) Date of Patent: *Mar. 26, 2019

(54) METHOD FOR FORMING PATTERN, STRUCTURAL BODY, METHOD FOR PRODUCING COMB-SHAPED ELECTRODE, AND SECONDARY CELL

(71) Applicant: Tokyo Ohka Kogyo Co., Ltd., Kawasaki-shi (JP)

(72) Inventors: Takahiro Asai, Kawasaki (JP); Kaoru Ishikawa, Kawasaki (JP)

(73) Assignee: TOKYO OHKA KOGYO CO., LTD., Kawasaki-shi (JP)

( * ) Notice: Subject to any disclaimer, the term of this patent is extended or adjusted under 35 U.S.C. 154(b) by 491 days.

This patent is subject to a terminal disclaimer.

(21) Appl. No.: 14/229,131

(22) Filed: Mar. 28, 2014

(65) Prior Publication Data

US 2014/0295264 A1    Oct. 2, 2014

(30) Foreign Application Priority Data

Mar. 29, 2013  (JP) ................................ 2013-073803

(51) Int. Cl.
*G03F 7/023*    (2006.01)
*H01M 4/04*    (2006.01)
(Continued)

(52) U.S. Cl.
CPC .......... *H01M 4/0404* (2013.01); *B05D 1/322* (2013.01); *G03F 7/023* (2013.01); *G03F 7/039* (2013.01);
(Continued)

(58) Field of Classification Search
CPC .... H01M 4/04; H01M 4/0452; H05K 1/0298; H05K 3/10; H05K 3/107; H05K 3/1216; B05D 7/50
(Continued)

(56) References Cited

U.S. PATENT DOCUMENTS 5,388,328 A    2/1995   Yokono et al.
5,663,019 A    9/1997   Matsumura et al.
(Continued)

FOREIGN PATENT DOCUMENTS

JP    H10-228864 A    8/1998
JP    H11-191368 A    7/1999
(Continued)

OTHER PUBLICATIONS

Extended European Search Report issued in European Patent Application No. 14162289.4, dated Aug. 4, 2014.
(Continued)

*Primary Examiner* — Brian K Talbot
(74) *Attorney, Agent, or Firm* — Knobbe Martens Olson & Bear LLP

(57) ABSTRACT

A method for forming a pattern, a structural body, a method for producing a comb-shaped electrode, and a secondary cell. The pattern forming method, in which n patterns (n≥2) are formed on a support, includes forming a first resist layer on the support surface; and repeating: forming a guide hole through a kth resist layer by exposure and development, filling a kth pattern material into the guide hole by a screen printing process, removing the kth resist layer, and forming a (k+1)th resist layer on the support and all pattern materials, regarding kth (k=1 to n−1) pattern material and resist layer in order of k=1 to n−1; forming a guide hole and nth pattern material filling similarly, and removing the nth resist layer.

7 Claims, 6 Drawing Sheets

(51) Int. Cl.

| | | |
|---|---|---|
| *G03F 7/039* | (2006.01) | |
| *G03F 7/20* | (2006.01) | |
| *G03F 7/40* | (2006.01) | |
| *H01M 4/13* | (2010.01) | |
| *B05D 1/32* | (2006.01) | |
| *H01M 10/0525* | (2010.01) | |
| *H01M 6/40* | (2006.01) | |
| *H01M 4/139* | (2010.01) | |
| *H01M 4/66* | (2006.01) | |

(52) U.S. Cl.
CPC ............. *G03F 7/0397* (2013.01); *G03F 7/20* (2013.01); *G03F 7/40* (2013.01); *H01M 4/0414* (2013.01); *H01M 4/13* (2013.01); *H01M 6/40* (2013.01); *H01M 10/0525* (2013.01); *H01M 4/139* (2013.01); *H01M 4/661* (2013.01); *Y10T 428/24322* (2015.01)

(58) Field of Classification Search
USPC .................... 427/58, 97.2, 97.7, 98.4, 282
See application file for complete search history.

(56) References Cited

U.S. PATENT DOCUMENTS

| | | | |
|---|---|---|---|
| 6,106,992 A | 8/2000 | Asano et al. | |
| 6,350,674 B1 | 2/2002 | Okamura | |
| 8,043,795 B2* | 10/2011 | Iwashita | G03F 7/0035 |
| | | | 430/273.1 |
| 9,478,791 B2* | 10/2016 | Ishikawa | H01M 4/13 |
| 2003/0045076 A1 | 3/2003 | Hayashida | |
| 2003/0180633 A1 | 9/2003 | Sato et al. | |
| 2006/0154141 A1 | 7/2006 | Salot et al. | |
| 2006/0160028 A1* | 7/2006 | Lee | G03F 7/0035 |
| | | | 430/312 |
| 2007/0048897 A1* | 3/2007 | Card | H01L 21/486 |
| | | | 438/106 |
| 2009/0208886 A1* | 8/2009 | Takemura | G03F 7/0035 |
| | | | 430/326 |
| 2011/0256484 A1* | 10/2011 | Asai | H01M 4/0452 |
| | | | 430/319 |

FOREIGN PATENT DOCUMENTS

| | | | |
|---|---|---|---|
| JP | 2000-113814 A | 4/2000 | |
| JP | 2000-123729 A | 4/2000 | |
| JP | 2001-1 441 28 | 5/2001 | |
| JP | 2003-068667 A | 3/2003 | |
| JP | 2011-238589 | 11/2011 | |
| JP | 2012-023418 A | 2/2012 | |
| JP | 2014-066992 A | 4/2014 | |
| WO | WO 2006/039633 | * | 4/2006 |
| WO | WO2014/038454 A1 | 3/2014 | |

OTHER PUBLICATIONS

Office Action in Japanese Patent Application No. 2013-073803, dated Sep. 20, 2016.
Extended European search report issued in European Patent Application No. 13835967.4, dated Jul. 16, 2015.
International Search Report issued in International Application No. PCT/JP2013/073058 dated Nov. 12, 2013.
Notice of References Cited issued in U.S. Appl. No. 14/426,300, dated Jul. 13, 2016.
Notification of Reasons for Refusal issued in Japanese Patent Application No. 2013-026856, dated Dec. 20, 2016.
Office Action issued in European Patent Application No. 13835967.4, dated May 17, 2016.

* cited by examiner

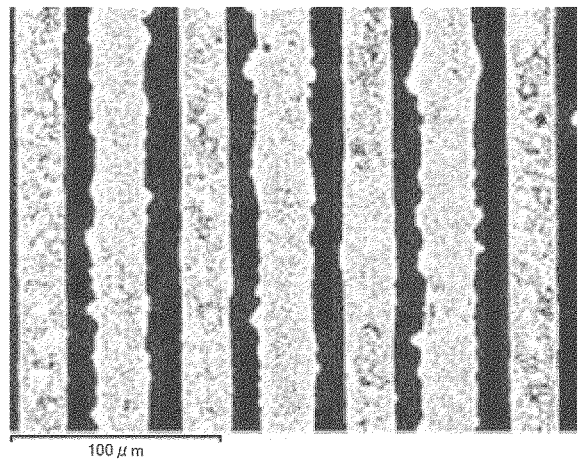
FIG. 4A
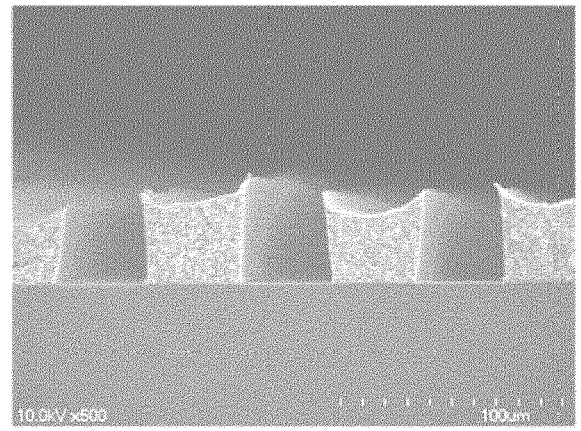
FIG. 4B
FIG. 4C
FIG. 4D
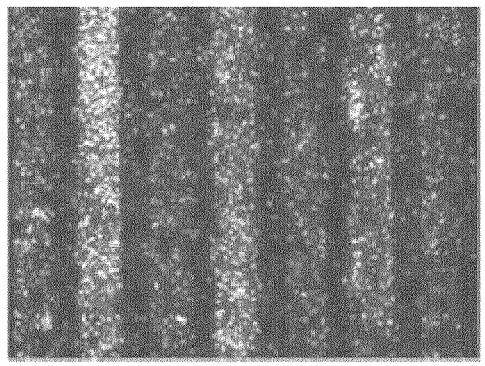
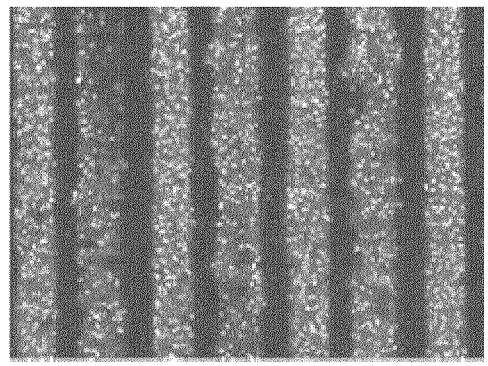

METHOD FOR FORMING PATTERN, STRUCTURAL BODY, METHOD FOR PRODUCING COMB-SHAPED ELECTRODE, AND SECONDARY CELL

RELATED APPLICATIONS

This application claims priority under 35 U.S.C. § 119(a)-(d) to Japanese Patent Application No. 2013-073803, filed Mar. 29, 2013, the content of which is incorporated herein by reference.

BACKGROUND OF THE INVENTION

Field of the Invention

The present invention relates to a method for forming a pattern in which a plurality of patterns of identical or different pattern materials are formed on a support, a structural body comprising the pattern formed by the method for forming a pattern, a method for producing a comb-shaped electrode using the method for forming a pattern, and a secondary cell comprising the comb-shaped electrode produced by the production method.

Related Art

Conventionally, when patterning an electrode or fluorescence substance on a support, a method has been employed in which a resist layer is formed on the support in advance, a guide hole acting as a casting mold during forming a pattern is formed, then a pattern material for the electrode or fluorescence substance is filled into the guide hole by a process such as injection and electrophoresis. For example, Patent Document 1 discloses in Examples that a comb-shaped electrode is prepared by forming a guide hole using a resist composition and depositing a positive-electrode active material into the guide hole by an electrophoresis process.

Patent Document 1: Japanese Unexamined Patent Application, Publication No. 2011-238589

SUMMARY OF THE INVENTION

However, it takes considerable time to fill the guide hole when using the process such as injection and electrophoresis, which makes it difficult to mass-produce patterns by the pattern forming method using these processes.

The present invention has been made in view of the problems described above; and it is an object of the present invention to provide a method for forming a pattern in which a plurality of patterns of identical or different pattern materials can be formed on a support in a short time, a structural body comprising the pattern formed by the method for forming a pattern, a method for forming a comb-shaped electrode using the method for forming a pattern, and a secondary cell comprising the comb-shaped electrode produced by the production method.

The present inventors have thoroughly investigated to solve the problems described above. As a result, it has been found that the above-mentioned problems can be solved by way of filling a pattern material into a guide hole by a screen printing process when forming a pattern, thereby completing the present invention. Specifically, the present invention provides the following.

A first aspect of the present invention relates to a method for forming a pattern, in which n patterns (n: an integer of at least 2) of identical or different pattern materials are formed on a support; and the method includes forming a first resist layer by coating a resist composition on a surface of the support, with respect to a kth pattern material and a kth resist layer in order of from k=1 to k=n−1 (k: an integer of 1 to n−1), repeating the steps of (i) to (iv): (i) forming a guide hole through a kth resist layer by exposure and development, (ii) filling a kth pattern material into the guide hole by a screen printing process, (iii) removing the kth resist layer, and (iv) forming a (k+1)th resist layer by coating a resist composition on the support and the 1st to kth pattern materials, forming a guide hole through a nth resist layer by exposure and development, filling a nth pattern material into the guide hole by a screen printing process, and removing the nth resist layer.

A second aspect of the present invention relates to a structural body comprising the pattern formed by the method for forming a pattern.

A third aspect of the present invention relates to a method for producing a comb-shaped electrode, in which a positive electrode and a negative electrode are each formed into a comb shape and oppositely disposed so that parts of teeth of the comb shapes are alternately arranged; and the method includes forming a conductive layer on a surface of a substrate, forming a current collector by patterning the conductive layer, and forming the positive electrode and the negative electrode on the current collector using the method for forming a pattern.

A fourth aspect of the present invention relates to a secondary cell comprising the comb-shaped electrode produced by the above-mentioned production method.

In accordance with the present invention, there can be provided a method for forming a pattern in which a plurality of patterns of identical or different pattern materials can be formed on a support in a short time, a structural body comprising the pattern formed by the method for forming a pattern, a method for producing a comb-shaped electrode using the method for forming a pattern, and a secondary cell comprising the comb-shaped electrode produced by the production method.

BRIEF DESCRIPTION OF THE DRAWINGS

FIGS. 4A, 4B, 4C, and 4D are photographs that show the results of SEM or EDX (energy dispersive X-ray spectroscopy) observation of an upper surface or cross section of a comb-shaped electrode produced in accordance with an embodiment of the method for producing a comb-shaped electrode of the present invention;

DETAILED DESCRIPTION OF THE INVENTION

Hereinafter, embodiments of the present invention are explained in detail with reference to figures.

FIGS. 1A to 1I are transverse sectional views showing the method for forming a pattern in accordance with an embodiment of the present invention. The pattern forming method in accordance with the embodiment of the present invention is explained with reference to FIGS. 1A to 1I. Here, the case of n=2 is explained in FIGS. 1A to 1I.

Figure 1A:
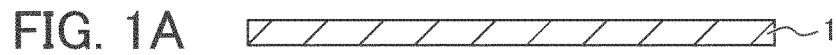
FIGS. 1A to 1I are transverse sectional views showing the method for forming a pattern in accordance with an embodiment of the present invention.
Figure 1B:

Initially, in the step shown in FIG. 1B, the first resist layer 2 is formed by coating a resist composition on the surface of the support 1 shown in FIG. 1A.

Conventional processes may be used for the process to form the first resist layer 2 by coating the resist composition on the surface of the support 1, without particular limitation thereto. In the first resist layer 2, the guide hole 3a is formed in order to form the pattern material layer 4a, as described later. The guide hole 3a becomes a casting mold when forming the pattern material layer 4a and thus is required to have sufficient depth for forming the pattern material layer 4a. The thickness of the first resist layer 2 becomes the future depth of the guide hole 3a and thus is appropriately set considering the necessary depth of the guide hole 3a. The thickness of the first resist layer 2 may be exemplified by 10 to 100 μm, without particular limitation thereto. The shape of the guide hole 3a and the below-mentioned guide hole 3b may be appropriately selected depending on the application of the resulting pattern without particular limitation thereto and may be a round hole, a trench hole, a comb-shaped space, etc.

The resist composition used for forming the first resist layer 2 may be conventional ones without particular limitation thereto and may be positive or negative type. Additionally, the positive-type resist composition may be non-chemical amplification type or chemical amplification type. The non-chemical amplification-type positive-type resist composition may be exemplified by those containing at least a quinonediazide group-containing compound and an alkali-soluble resin. On the other hand, the chemical amplification-type positive-type resist composition may be exemplified by those containing at least a photoacid generator and a resin which has an acid-dissociating elimination group and increases alkali solubility when the elimination group is eliminated by action of an acid generated from the photoacid generator through exposure. Furthermore, the negative-type resist composition may be exemplified by a polymerizable negative-type resist composition containing a least an alkali-soluble resin, a photopolymerizable monomer, and a photopolymerization initiator; a chemical amplification-type negative-type resist composition containing at least an alkali-soluble resin, a cross-linking agent, and an acid generator; and a chemical amplification-type negative-type resist composition for solvent-development processes containing at least a photoacid generator and a resin which has an acid-dissociating elimination group and increases alkali solubility when the elimination group is eliminated by action of an acid generated from the photoacid generator through exposure. Among them, the chemical amplification-type resist composition is preferable and the positive-type resist composition is more preferable, since the first resist layer 2 is likely to be removed more easily in the step shown in FIG. 1E (explained later).

Figure 1C:

Next, the step shown in FIG. 1C is explained.

In this step, initially, the first resist layer 2 is selectively exposed through a desired mask. Consequently, when the positive-type resist composition is used for forming the first resist layer 2, the part to be the future guide hole 3a becomes soluble to a developer and the part not to be the future guide hole 3a retains its insolubility to the developer. On the other hand, when the negative-type resist composition is used for forming the first resist layer 2, the part not to be the future guide hole 3a becomes insoluble to a developer and the part to be the future guide hole 3a retains its solubility to the developer. As necessary, heating (PEB) is carried out after the selective exposure.

The selectively exposed first resist layer 2 is developed. The development can be carried out by conventional processes using conventional developers. The developer may be exemplified by alkaline aqueous solutions and, in cases of solvent development processes, ester-type solvents such as butyl acetate and ketone-type solvents such as methylamyl ketone. Additionally, the developing process may be exemplified by immersion processes, spray processes, puddle processes, dynamic dispense processes, etc.

The guide hole 3a penetrating up to the surface of the support 1 is formed in the developed first resist layer 2. The guide hole 3a is used as a casting mold in order to deposit a pattern material in the step shown in FIG. 1D (explained below). As necessary, after-curing by irradiation with an active energy beam such as UV rays or post-baking as additional heat treatment is applied to the first resist layer 2 where the guide hole 3a has been formed. Solvent resistance and plating solution resistance of the first resist layer 2 necessary at the step of filling a pattern material, as described later, are further improved by applying the after-curing or post-baking.

Figure 1D:

Next, the step shown in FIG. 1D is explained.

In this step, a first pattern material is filled into the guide hole 3a formed in the step shown in FIG. 1C by a screen printing process. That is, the first pattern material layer 4a is formed on the surface of the support 1 using the guide hole 3a as a casting mold.

The screen printing process may be carried out using a commercially available screen printer while appropriately adjusting squeegee pressure; squeegee speed; material, hardness, grinding angle, etc. of the squeegee used, for example.

Figure 1E:

Next, the step shown in FIG. 1E is explained.

In this step, the first resist layer 2 is removed. Specifically, a process of peeling the first resist layer 2 using a peeling liquid may be exemplified. In this case, immersion processes, spray processes, shower processes, puddle processes, etc. may be used as the peeling process without particular limitation thereto. Additionally, the peeling liquid may be appropriately selected depending on the components of the resist composition used for the resist layer and may be exemplified by 3 to 15 mass % aqueous solution of sodium hydroxide, aqueous solution of potassium hydroxide, organic amines, aqueous solution of tetramethyl ammonium hydroxide, triethanolamine, N-methylpyrrolidone, dimethyl sulfoxide, acetone, and other resist solvents such as propyleneglycol monomethylether acetate. The peeling treatment time may be exemplified by about 1 to 120 minutes without particular limitation thereto. Here, the peeling liquid may be warmed to about 25 to 60° C.

In this step, one pattern of the first pattern material is formed on the support.

Figure 1F:
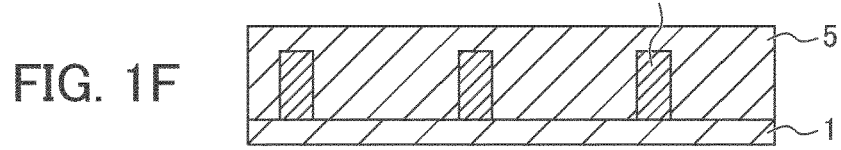

Next, the step shown in FIG. 1F is explained.

In this step, the resist composition is coated on the support 1 and the first pattern material layer 4a to thereby form the second resist layer 5. In the second resist layer 5, the guide hole 3b is formed for forming the pattern material layer 4b, as described later. The guide hole 3b becomes a mold when forming the pattern material layer 4b and thus is required to have sufficient depth for forming the pattern material layer 4b. The second resist layer 5 is formed on the first pattern material layer 4a and thus also functions as the protective layer of the first pattern material layer 4a. That is, if the guide hole 3b is formed without forming the second resist layer 5 on the first pattern material layer 4a, as described later, the first pattern material layer 4a contacts the developer and flows out in the process. As described above, the contact to the developer and flow out of the first pattern material layer 4a can be prevented by forming the second resist layer 5 on the first pattern material layer 4a.

The type and coating process of the resist composition are similar to those described above as to the step shown in FIG. 1B. The resist composition used in the step shown in FIG. 1F may be the same as the resist composition used in the step shown in FIG. 1B or different therefrom in terms of compositional component or type.

The thickness of the second resist layer 5 is not particularly limited as long as its function as the protective layer for the first pattern material layer 4a is assured; and the thickness thereof is appropriately set considering the depth required for the guide hole 3b formed in the step shown in FIG. 1G explained below and may be exemplified by 1 to 20 µm.

Figure 1G:

Next, the step shown in FIG. 1G is explained.

In this step, initially, the second resist layer 5 is selectively exposed through a desired mask. Consequently, when the positive-type resist composition is used for forming the second resist layer 5, the part to be the future guide hole 3b becomes soluble to a developer and the part not to be the future guide hole 3b retains its insolubility to the developer. On the other hand, when the negative-type resist composition is used for forming the second resist layer 5, the part not to be the future guide hole 3b becomes insoluble to a developer and the part to be the future guide hole 3b retains its solubility to the developer. As necessary, heating (PEB) is carried out after the selective exposure.

The selectively exposed second resist layer 5 is developed. The developer and the developing process are similar to those explained in terms of the step shown in FIG. 1C.

The guide hole 3b penetrating up to the surface of the support 1 is formed in the developed second resist layer 5. The guide hole 3b is used as a casting mold in order to deposit a pattern material in the step shown in FIG. 1H (explained below). As necessary, after-curing by irradiation with an active energy beam such as UV rays or post-baking as additional heat treatment is applied to the second resist layer 5 where the guide hole 3b has been formed. Solvent resistance and plating solution resistance of the second resist layer 5 necessary at the step of filling a pattern material, as described later, are further improved by applying the after-curing or post-baking.

Figure 1H:

Next, the step shown in FIG. 1H is explained.

In this step, a second pattern material is filled into the guide hole 3b formed in the step shown in FIG. 1G by a screen printing process. That is, the second pattern material layer 4b is formed on the surface of the support 1 using the guide hole 3b as a casting mold.

The conditions of the screen printing process are similar to those explained in terms of the step shown in FIG. 1D.

Figure 1I:
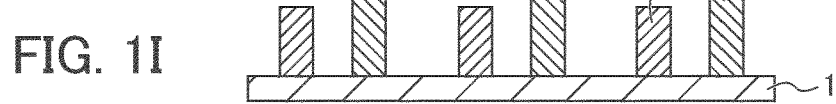

Next, the step shown in FIG. 1I is explained.

In this step, the second resist layer 5 is removed. Specifically, a process of peeling the second resist layer 5 using a peeling liquid may be exemplified. The peeling process, peeling liquid, and peeling treatment time are similar to those explained in terms of the step shown in FIG. 1E.

By the way described above, two patterns of the first and second pattern materials can be formed on the support.

The case of n=2 is explained in FIGS. 1A to 1I; concerning the cases where n is at least 3, n patterns of identical or different pattern materials can be formed on the support by repeating necessary times of the steps shown in FIGS. 1C to 1F.

The pattern material may be appropriately selected depending on the application of the resulting pattern without particular limitation thereto and may be exemplified by positive-electrode material/negative-electrode material, fluorescent body (RGB), medical marker, article tag, etc.

The pattern resulting from the pattern forming method shown in FIGS. 1A to 1I can also be formed by another pattern forming method shown in FIGS. 2A to 2H. FIGS. 2A to 2H are transverse sectional views showing a pattern forming method different from the pattern forming method shown in FIGS. 1A to 1I. The pattern forming method shown in FIGS. 2A to 2H includes a step of forming the second resist layer 5 on the first resist layer 2 and the first pattern material layer 4a while the first resist layer 2 remains even after forming the first pattern material layer 4a.

Hereinafter, the pattern forming method shown in FIGS. 2A to 2H is simply explained for comparison.

FIGS. 2A to 2D are respectively in common with FIGS. 1A to 1D.

Figure 2A:
FIGS. 2A to 2H are transverse sectional views showing a pattern forming method different from the pattern forming method shown in FIGS. 1A to 1I.
Figure 2B:
Figure 2C:
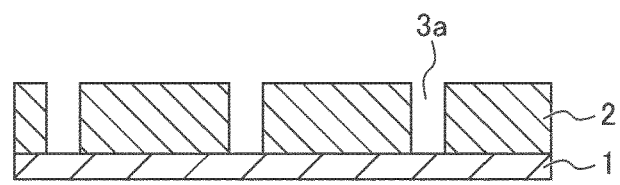
Figure 2D:
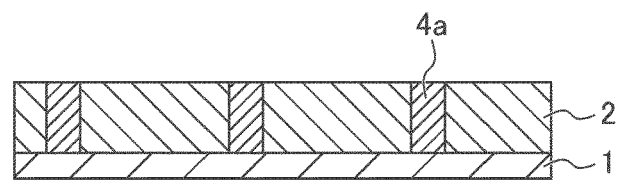
Figure 2E:
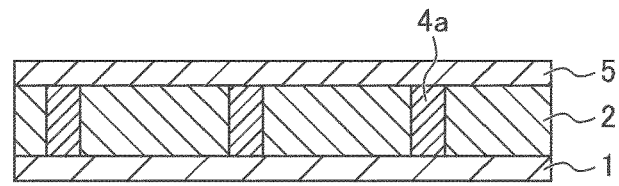

In the step shown in FIG. 2E, the positive-type resist composition is coated on the first resist layer 2 and the first pattern material layer 4a to thereby form the second resist layer 5. The second resist layer 5 functions as the protective layer of the first pattern material layer 4a.

Figure 2F:
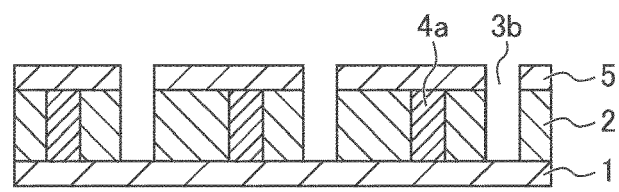

In the step shown in FIG. 2F, the first resist layer 2 and the second resist layer 5 are selectively exposed through a desired mask. The selectively exposed first resist layer 2 and second resist layer 5 are developed. In the developed first resist layer 2 and second resist layer 5, the guide hole 3b penetrating up to the surface of the support 1 is formed. As necessary, heating (PEB) following the selective exposure and/or after-curing or post-baking following the development are applied.

Figure 2G:
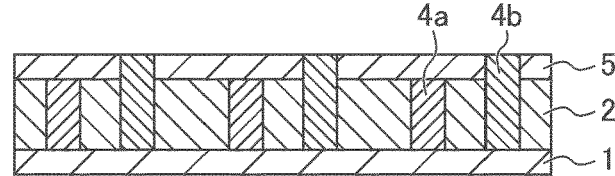

In the step shown in FIG. 2G, a second pattern material is filled into the guide hole 3b formed in the step shown in FIG. 2F by a screen printing process. That is, the second pattern material layer 4b is formed on the surface of the support 1 using the guide hole 3b as a casting mold.

Figure 2H:
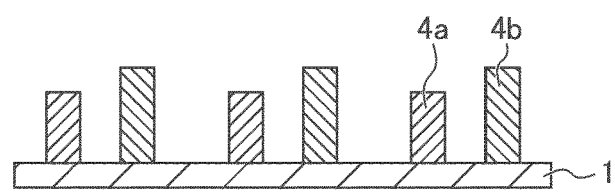

In the step shown in FIG. 2H, the first resist layer 2 and the second resist layer 5 are removed.

By the way described above, two patterns of the first and second pattern materials are formed on the support.

The case of n=2 is explained in FIGS. 2A to 2H; concerning the cases where n is at least 3, n patterns of identical or different pattern materials can be formed on the support by repeating necessary times of the steps shown in FIGS. 2C to 2E.

In the pattern forming method shown in FIGS. 2A to 2H, bubbles tend to appear mainly in the first resist layer 2 when the positive-type resist composition coated in the step shown in FIG. 2E is dried by heating (prebaking), or when heating (PEB) after selective exposure is carried out in the step shown in FIG. 2F. As a result, the shape of the guide hole 3b tends to deform, and thus it becomes difficult to form the second pattern material layer 4b with a desired shape since the second pattern material cannot be sufficiently filled into the guide hole 3b. Furthermore, there may arise a case where short circuit occurs between the first pattern material layer 4a and the second pattern material layer 4b.

In contrast, concerning the pattern forming method according to the embodiment of the present invention shown in FIGS. 1A to 1I, bubbles are unlikely to appear in the resist layer since the first resist layer 2 is removed in the step shown in FIG. 1E and then the second resist layer 5 is freshly formed in the step shown in FIG. 1F. As a result, since the shape of the guide hole 3b is unlikely to deform, the second pattern material can be sufficiently filled into the guide hole 3b and thus it becomes easy to form the second pattern material layer 4b with a desired shape. Furthermore, short circuit is unlikely to occur between the first pattern material layer 4a and the second pattern material layer 4b. Accordingly, yield ratio of pattern formation can be effectively enhanced.

The structural body according to the present invention comprises the pattern resulting from the pattern forming method described above. Such a structural body may be exemplified by cells and specifically secondary cells comprising a comb-shaped electrode.

The comb-shaped electrode may be exemplified by one in which a positive electrode and a negative electrode are each formed into a comb shape and oppositely disposed so that the parts of teeth of the comb shapes are alternately arranged. More specifically, the comb-shaped electrodes 11a and 11b shown in FIG. 3 may be exemplified.

The comb-shaped electrodes 11a and 11b are simply explained with reference to FIG. 3. The comb-shaped electrodes 11a and 11b are each formed into a comb shape and oppositely disposed so that the parts of teeth of the comb shapes are alternately arranged. Here, the comb-shaped electrode 11a is a positive electrode and the comb-shaped electrode 11b is a negative electrode. Such a configuration of the comb-shaped electrodes 11a and 11b leads to a shorter distance between the electrodes and a constant electrolyte resistance, thus exchange of lithium ion can be effectively performed, thereby electric capacitance can be increased.

Between the comb-shaped electrode 11a and the comb-shaped electrode 11b, there is provided space or a separator (not shown) for isolating the both, and the both are electrically separated. The comb-shaped electrodes 11a and 11b are formed on the surface of the substrate 14 of which the surface is a non-conductor. Such a substrate 14 may be exemplified by silicon substrates having an oxide film on their surface. Preferably, an adhesion imparting layer described later is further formed on the upper layer of the oxide film of the silicon substrate.

The comb-shaped electrode 11a of a positive electrode has the current collector 12a to draw a current and the positive-electrode active material layer 13a formed on the surface of the current collector 12a. The current collector 12a is formed into a comb shape in planar view. Then, the positive-electrode active material layer 13a is formed on the surface of the comb-shaped current collector 12a and formed into a comb shape in planar view similarly to the current collector 12a.

In order to impart conductivity, the current collector 12a is constructed from metal and preferably gold. Then, in order to ensure the adhesion between the current collector 12a and the substrate 14, an adhesion imparting layer (not shown) is formed between the current collector 12a and the substrate 14 as necessary. The adhesion imparting layer is appropriately set considering the material of the current collector 12a and the material of the substrate 14. As an example, when the current collector 2a is constructed from gold and the substrate 14 is constructed from silicon, a thin film of titanium is preferably used as the adhesion imparting layer. The thickness of the current collector 12a and the thickness of the adhesion imparting layer may be optionally set without particular limitation thereto. As an example, the thickness of the current collector 12a is 100 nm and the thickness of the adhesion imparting layer is 50 nm, without particular limitation thereto.

The comb-shaped electrode 11b of a negative electrode has the current collector 12b to draw a current and the negative-electrode active material layer 13b formed on the surface of the current collector 12b. The other items of the comb-shaped electrode 11b are similar to those of the comb-shaped electrode 11a of a positive electrode; therefore, explanations thereof are omitted.

An electrolyte (not shown) is provided between the comb-shaped electrode 11a of a positive electrode and the comb-shaped electrode 11b of a negative electrode. Consequently, the comb-shaped electrode 11a and the comb-shaped electrode 11b each cause an electrode reaction, and the current can be drawn from the current collector 12a and the current collector 12b.

The entire size of comb-shaped electrodes; the thickness, length, and number of teeth in the comb-shaped electrode 11a or the comb-shaped electrode 11b; the space between two adjacent teeth; the thickness of active material layers, etc. may be appropriately adjusted depending on the desirable charged capacity and discharged capacity. For example, 10 to 50 μm of the thickness of teeth, 30 to 70 μm of the space between two adjacent teeth, and 10 to 50 μm of the thickness of active material layers may be employed.

The material to construct the positive-electrode active material layer 13a and the negative-electrode active material layer 13b and the type of the electrolyte may be appropriately set depending on the type of the cell to be formed. In regards to a lithium ion secondary cell, as an example, the material to construct the positive-electrode active material layer 13a may be exemplified by transition metal oxides such as lithium cobaltate, the material to construct the negative-electrode active material layer 13b may be exemplified by carbon, graphite, lithium titanate, etc.; and the electrolyte may be exemplified by electrolyte liquids containing a salt such as lithium perchlorate and lithium hexafluorophosphate and an organic solvent in which the salt is soluble such as carbonate ester compounds including ethylene carbonate, dimethyl carbonate and diethyl carbonate, and acetonitrile, and mixtures of two or more of them, and gel-like electrolytes containing the above-mentioned electrolyte liquids and polymers such as polyethylene oxide, polypropylene oxide, polyacrylonitrile, and polymethacrylonitrile. Occurrence of liquid leak from the resulting secondary cells can be effectively reduced by use of the above-mentioned gel-like electrolyte as the electrolyte.

More specifically, the active material may be exemplified by particles of positive-electrode active materials such as $LiCoO_2$, $LiFePO_4$, and $LiMn_2O_4$ and particles of negative-electrode active materials such as graphite, $Li_4Ti_5O_{12}$, Sn alloys, and Si-based compounds. When forming the active material layer, preferably, the active material is used in a condition of dispersion liquid where the active material is dispersed in a dispersion medium. The dispersion medium used may be exemplified by water, acetonitrile, N-methylpyrrolidone, acetone, ethanol, etc. Preferably, the amount of the dispersion medium used is the amount that leads to 35 to 60 mass % of solid content concentration in the dispersion liquid.

The dispersion liquid typically contains a binder such as styrene-butadiene rubber (SBR) and polyvinylidene fluoride. The dispersion liquid may also contain a conductive aid such as carbon black (e.g. acetylene black) and a dispersant such as carboxymethylcellulose. The contents of the active material, binder, conductive aid, and dispersant in the solid content of the dispersion liquid are not particularly limited. In the solid content of the dispersion liquid, the content of the active material is preferably 85 to 99 mass %, the content of the binder is preferably 1 to 15 mass %, the content of the conductive aid is preferably 0 to 9 mass %, and the content of the dispersant is preferably 0 to 7 mass %. Particularly, when the content of the conductive aid is within the above-mentioned range, belt-like residual dross of active materials extending in a squeegee-moving direction is unlikely to appear on the surface of the resist layer 2 or 5 during filling the dispersion liquid into the guide hole 3a or 3b by a screen printing process in the step shown in FIG. 1D or 1H and also whisker-like residual dross of active materials is unlikely to appear in the resulting comb-shaped electrodes, thereby short circuit between electrodes can be effectively prevented.

In the above-mentioned electrolyte, preferably, the content of the salt is adjusted such that the concentration of metal atom (e.g. lithium atom) constituting the salt is 0.2 to 2.0 M. In the above-mentioned gel-like electrolyte, preferably, the content of the polymer is 2 to 80 mass %. The above-mentioned electrolyte liquid may also contain an additive including unsaturated cyclic carbonate ester compounds such as vinylene carbonate, halogen-substituted carbonate ester compounds such as fluoroethylene carbonate, cyclic sulfonate-based compounds such as 1,3-propane sultone, cyclic sulfite ester compounds such as ethylene sulfite, crown ethers such as 12-crown-4, and aromatic compounds such as benzene and toluene. When the electrolyte liquid contains the additive, operating life of the resulting secondary cells tends to be longer. The concentration of the additive is preferably 0.1 to 20 mass % in the electrolyte liquid.

The comb-shaped electrodes 11a and 11b shown in FIG. 3 can be produced by forming a conductive layer on the surface of the substrate 14, patterning the conductive layer to form current collectors 12a and 12b, and forming a positive electrode and a negative electrode on the current collectors 12a and 12b using the pattern forming method according to the embodiment of the present invention explained with reference to FIGS. 1A to 1I, for example. The conductive layer and current collectors 12a and 12b can be formed by the method described in Patent Document 1, for example. The negative and positive electrodes can be formed on the current collectors 12a and 12b by forming a pattern in accordance with FIGS. 1A to 1I using the current collectors 12a and 12b of FIG. 3 as the support in FIGS. 1A to 1I, using the positive-electrode active material layer 13a of FIG. 3 as the first pattern material layer 4a in FIGS. 1A to 1I, and using the negative-electrode active material layer 13b of FIG. 3 as the second pattern material layer 4b in FIGS. 1A to 1I, for example.

EXAMPLES

The present invention is explained more specifically with reference to examples hereinafter; however, the present invention is not limited to the examples at all.

Synthesis Example 1

Propyleneglycol monomethylether acetate (PGMEA) as a solvent was added to 70 parts by mass of a cresol-type novolac resin (mass average molecular weight: 30000) resulting from an ordinary method of addition condensation between a mixture of m-cresol and p-cresol (m-cresol/p-cresol=6/4 (mass ratio)) and formaldehyde in the presence of an acid catalyst, 15 parts by mass of naphthoquinone-1,2-diazide-5-sulfonic acid diester of 1,4-bis(4-hydroxyphenyl isopropylidenyl)benzene as a photosensitizing agent, and 15 parts by mass of poly(methyl vinyl ether) (mass average molecular weight: 100000) as a plasticizer such that the solid content concentration is 40 mass % followed by mixing and dissolving them, thereby obtaining a resist composition 1. The resist composition 1 is novolac type, non-chemical amplification type, and positive type.

Synthesis Example 2

52.5 parts by mass of a cresol-type novolac resin (mass average molecular weight: 10000) resulting from an ordinary method of addition condensation between a mixture of m-cresol and p-cresol (m-cresol/p-cresol=6/4 (mass ratio)) and formaldehyde in the presence of an acid catalyst, 10 parts by mass of a polyhydroxystyrene resin VPS-2515 (manufactured by Nippon Soda Co.), 27.5 parts by mass of a resin expressed by Formula (1) below, 10 parts by mass of a resin expressed by Formula (2) below, 2 parts by mass of a compound expressed by Formula (3) below as an acid generator, 2 parts by mass of 1,5-dihydroxynaphthalene as a sensitizer, 0.01 parts by mass of triethylamine and 0.02 parts by mass of salicylic acid as additives, and 107 parts by mass of PGMEA and 6 parts by mass of gamma-butyrolactone as solvents were mixed and dissolved, thereby obtaining a resist composition 2. The resist composition 2 is chemical amplification type and positive type.

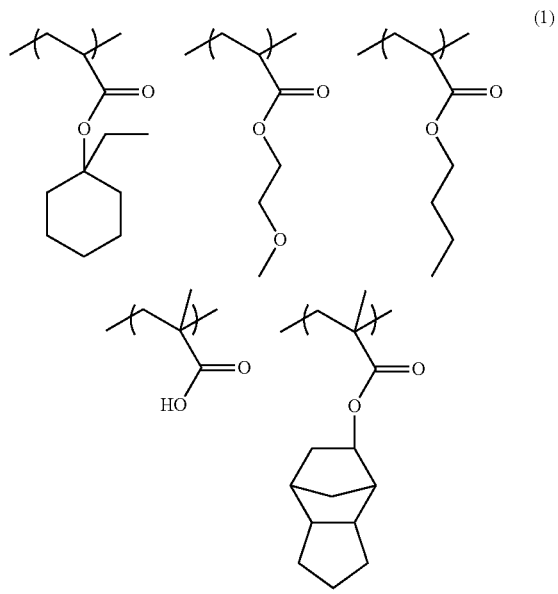

(1)

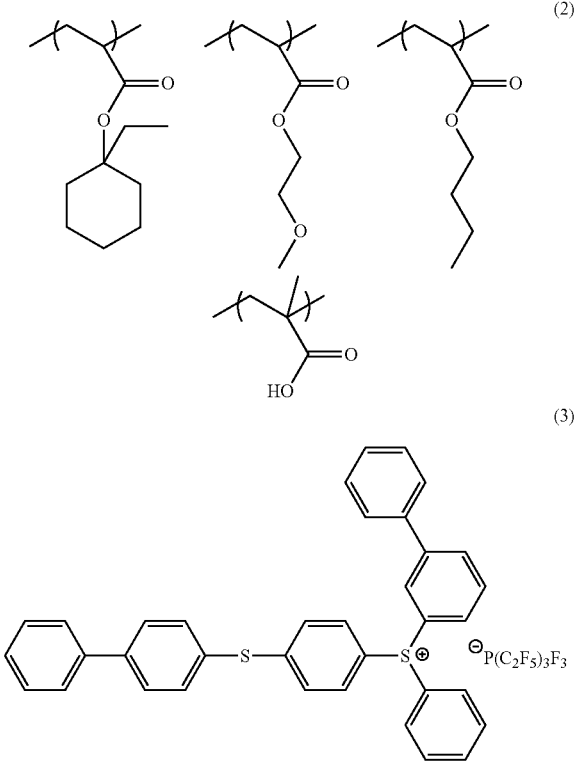

Example 1

Figure 3:
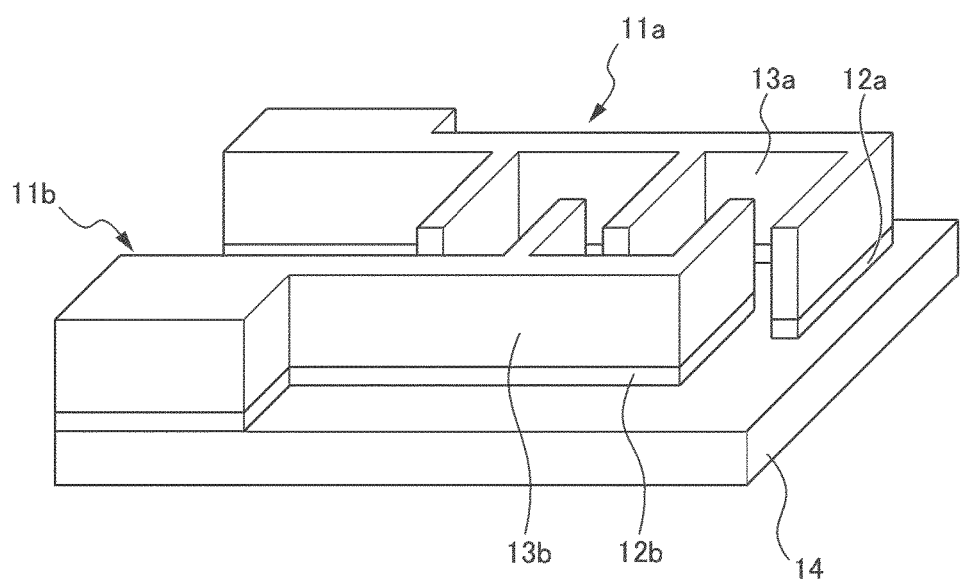
FIG. 3 is a perspective view schematically showing comb-shaped electrodes produced in accordance with an embodiment of the method for producing a comb-shaped electrode of the present invention.

The comb-shaped electrodes 11a and 11b shown in FIG. 3 were prepared using a screen printing process.
(Formation of Current Collector)

Initially, an aluminum film (thickness: 200 nm) as a conductive layer was formed by a sputtering process on the surface of a silicon substrate having an oxide film on the upper layer of which a titanium thin film had been formed as an adhesion imparting layer (i.e. the surface of titanium thin film). The positive-type resist composition 1 of Synthesis Example 1 was coated on the substrate by a spin coating process to thereby form a resist layer of 1.5 μm, followed by drying at 120° C. for 1 minute. Then, the resist layer was selectively exposed (ghi mixed rays, exposure amount: 100 mJ/cm$^2$) using a mask with a pattern corresponding to the comb-shaped electrodes 11a and 11b shown in FIG. 3. Next, development was carried out with an alkaline developer of 2.38 mass % TMAH for 1 minute. After the development, the aluminum film and the titanium thin film were etched by a dipping process using an aluminum etching liquid ($H_3PO_4$:$HNO_3$:$H_2O$=4:1:1.6 (mass ratio)) to thereby form an aluminum pattern (pattern having a pattern of titanium thin film at the lower layer), thereby forming comb-shaped current collectors 12a and 12b.
(Preparation of Guide Hole (i))

The resist composition of Synthesis Example 1 was coated by a spin coating process on a surface of silicon wafer on which the current collector had been formed, to thereby form a resist layer of 50 μm, followed by drying at 140° C. for 5 minutes. Then, using a positive mask having the same shape in planar view as that of the above-formed comb-shaped current collector 12a, the resist layer at the position above the comb-shaped current collectors was exposed (ghi mixed rays, exposure amount: 60 mJ/cm$^2$). Next, baking was carried out at 85° C. for 3 minutes as an activation step, followed by development with an alkaline developer. Consequently, a comb-shaped guide hole having the same shape in planar view as that of the current collector 12a was formed on the surface of the silicon wafer. The current collector 12a was exposed at the base of the guide hole.
(Formation of Active Material Layer (i))

36.54 g of LiFePO$_4$ particles, 2.52 g of acetylene black as a conductive aid, 2.10 g of carboxymethylcellulose as a dispersant, and 0.84 g of styrene-butadiene rubber (SBR) as a binder (mass ratio of 87:6:5:2) were mixed and 58 g of water was further added and mixed, thereby obtaining a dispersion liquid with a solid content of 42 mass %. The dispersion liquid was further mixed and dispersed by rotating at 2000 rpm for 10 minutes in a rotation-revolution type mixer (product name: Awatori Neritaro, manufactured by Thinky Co.) and the resulting mixture was used as a positive-electrode active material.

The screen printing was carried out on the silicon wafer where the guide hole had been formed and the positive-electrode active material was filled into the guide hole followed by drying at 100° C. for 5 minutes, thereby forming a positive-electrode active material layer. The screen printing was carried out at a squeegee pressure of 180 MPa and a squeegee speed of 15.0 mm/sec using a screen printer (model MT-320T, manufactured by Micro-tec Co.) equipped with a silicon squeegee polished to an angle of 45° and having a hardness of 60°.
(Peeling of Resist Layer (i))

The resist layer was peeled off with acetone.
(Preparation of Guide Hole (ii))

The resist composition 2 of Synthesis Example 2 was coated by a spin coating process on a surface of silicon wafer on which the positive-electrode active material had been deposited to thereby form a resist layer of 60 μm, followed by drying at 140° C. for 1 minute.

Using a positive mask having the same shape in planar view as that of the above-formed comb-shaped current collector 12b, the resist layer at the position above the comb-shaped current collectors was exposed (ghi mixed rays, exposure amount: 60 mJ/cm$^2$). Next, baking was carried out at 85° C. for 3 minutes as an activation step, followed by development with an alkaline developer. Consequently, while protecting the positive-electrode active material by the resist layer functioning also as a protective layer, a comb-shaped guide hole having the same shape in planar view as that of the current collector 12b was formed on the surface of the silicon wafer. The current collector 12b was exposed at the base of the guide hole.
(Formation of Active Material Layer (ii))

36.54 g of Li$_4$Ti$_5$O$_{12}$ particles, 2.52 g of acetylene black as a conductive aid, 2.10 g of carboxymethylcellulose as a dispersant, and 0.84 g of SBR as a binder (mass ratio of 87:6:5:2) were mixed and 58 g of water was further added and mixed, thereby obtaining a dispersion liquid with a solid content of 42 mass %. The dispersion liquid was further mixed and dispersed by rotating at 2000 rpm for 10 minutes in a rotation-revolution type mixer (product name: Awatori Neritaro, manufactured by Thinky Co.) and the resulting mixture was used as a negative-electrode active material.

The screen printing was carried out on the silicon wafer where the guide hole had been formed and the negative-electrode active material was filled into the guide hole followed by drying at 100° C. for 5 minutes, thereby forming a negative-electrode active material layer. The screen printing was carried out at a squeegee pressure of 180 MPa and a squeegee speed of 15.0 mm/sec using a screen printer (model MT-320T, manufactured by Micro-tec Co.) equipped with a silicon squeegee polished to an angle of 45° and having a hardness of 60°.
(Peeling of Resist Layer (ii))

Finally, the resist layer was peeled off with acetone, thereby obtaining comb-shaped electrodes 11a and 11b. The time required for filling the electrode active materials by the screen printing process was as very short as 15 minutes.

Comparative Example 1

The comb-shaped electrodes 11a and 11b shown in FIG. 3 were prepared using an injection process.
(Formation of Current Collector)

Comb-shaped current collectors 12a and 12b were formed similarly to Example 1.
(Preparation of Guide Hole)

The resist composition of Synthesis Example 1 was coated by a spin coating process on a surface of silicon wafer on which the current collector had been formed to thereby form a resist layer of 50 μm, followed by drying at 140° C. for 5 minutes. Then, using a positive mask having the same shape in planar view as that of the above-formed comb-shaped current collector, the resist layer at the position above the comb-shaped current collectors was exposed (ghi mixed rays, exposure amount: 60 mJ/cm$^2$). Next, baking was carried out at 85° C. for 3 minutes as an activation step, followed by development with an alkaline developer. Consequently, a comb-shaped guide hole was formed on the surface of the silicon wafer. The current collector was exposed at the base of the guide hole.
(Formation of Active Material Layer)

Using a micropipette, among the guide holes formed as described above, the positive-electrode active material of Example 1 was made to fall in drops around the guide holes corresponding to positive electrodes and the negative-electrode active material of Example 1 was made to fall in drops around the guide holes corresponding to negative electrodes to carefully allow flowing into the guide holes with a comb-shaped pattern. Subsequently, an active material layer was formed by drying at 100° C. for 5 minutes. Finally, the resist layer was peeled off with acetone, thereby obtaining comb-shaped electrodes 11a and 11b. The time required for filling the electrode active materials by the injection process was as very long as 3 hours.

Example 2

The upper surface and cross section of the comb-shaped electrodes 11a and 11b resulting from Example 1 were observed by SEM and EDX (energy dispersive X-ray spectroscopy). Note that the cross section was observed only by SEM. The results are shown in FIGS. 4A, 4B, 4C, and 4D. Here, FIGS. 4A, 4C, and 4D show photographs of the same view field. As shown in FIGS. 4A and 4B, in regards to the comb-shaped electrodes 11a and 11b, it could be confirmed that the positive-electrode active material and the negative-electrode active material were filled with tracing the shape of guide holes without variation. In FIG. 4A, the leftmost one is a negative electrode, and a negative electrode and a positive electrode are alternately arranged toward the right side. Furthermore, as shown in FIG. 4C, existence of phosphorus was observed in the positive electrodes and thus filling of the positive-electrode active material could be confirmed. On the other hand, as shown in FIG. 4D, existence of titanium was observed in the negative electrodes and thus filling of the negative-electrode active material could be confirmed. Note that, in regards to FIG. 4D where signals were also detected in the positive electrodes, the signals were derived from detecting the titanium used for forming the adhesion imparting layer. From the fact that the signals were detected more intensely by the negative electrodes than by the positive electrodes in FIG. 4D, it can be understood that the negative-electrode active material was filled into the negative electrodes.

Example 3

Presence or Absence of Bubble Formation in Resist Layer

Figure 5A:
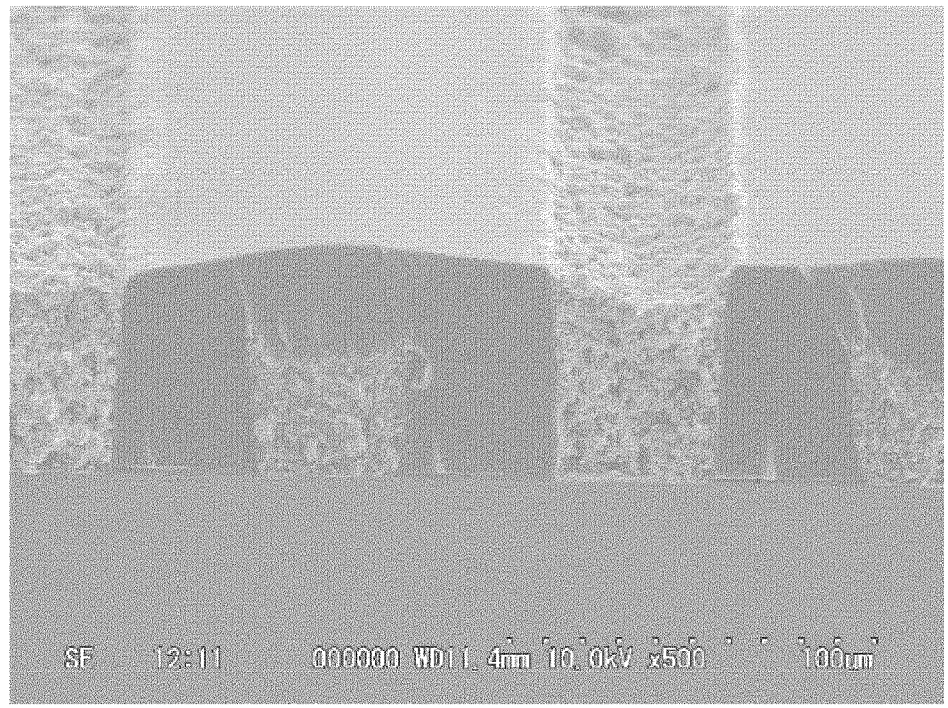
FIGS. 5A and 5B are photographs that show the results of SEM observation of cross sections of resist layers at the step where a negative-electrode active material layer was formed by the pattern forming method shown in FIGS. 1A to 1I or FIGS. 2A to 2H.

As a result of observing the cross section of the resist layer by SEM at the stage of forming the negative-electrode active material layer in Example 1, bubble formation was not observed in the resist layer. The results are shown in FIG. 5A.

Comparative Example 2

In accordance with the descriptions of Formation of Current Collector, Preparation of Guide Hole (i), and Formation of Active Material Layer (i) in Example 1, comb-shaped current collectors 12a and 12b, a resist layer, a guide hole, and a positive-electrode active material layer were formed.
(Formation of Protective Layer)

The resist composition 2 of Synthesis Example 2 was coated by a spin coating process on the resist layer and the positive-electrode active material layer formed on the surface of silicon wafer to thereby form a resist layer of 10 μm followed by drying at 140° C., thereby forming a protective layer.
(Preparation of Guide Hole (ii))

Using a positive mask having the same shape in planar view as that of the above-formed comb-shaped current collector 12b, the resist layer at the position above the comb-shaped current collectors was exposed (ghi mixed rays, exposure amount: 60 mJ/cm$^2$). Next, baking was carried out at 85° C. for 3 minutes as an activation step, followed by development with an alkaline developer. Consequently, while protecting the positive-electrode active material by the protective layer, a comb-shaped guide hole having the same shape in planar view as that of the current collector 12b was formed on the surface of the silicon wafer. The current collector 12b was exposed at the base of the guide hole.
(Formation of Active Material Layer (ii))

The screen printing was carried out on the silicon wafer where the guide hole had been formed and the negative-electrode active material of Example 1 was filled into the guide hole followed by drying at 100° C. for 5 minutes, thereby forming a negative-electrode active material layer. The screen printing was carried out at a squeegee pressure of 180 MPa and a squeegee speed of 15.0 mm/sec using a screen printer (model MT-320T, manufactured by Micro-tec Co.) equipped with a silicon squeegee polished to an angle of 45° and having a hardness of 60°.
(Peeling of Resist Layer)

Finally, the resist layer was peeled off with acetone, thereby obtaining comb-shaped electrodes 11a and 11b.
(Presence or Absence of Bubble Formation in Resist Layer)

Figure 5B:
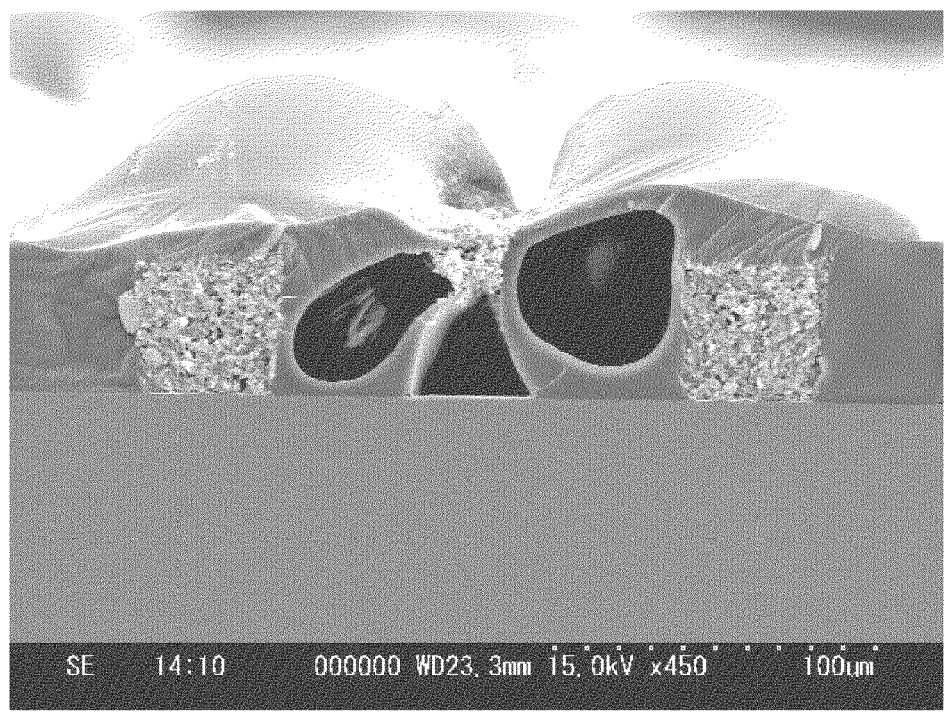

As a result of observing the cross section of the resist layer by SEM at the stage of forming the negative-electrode active material layer, bubble formation was observed in the resist layer. As a consequence of the bubble formation, the shape of the guide hole formed in Preparation of Guide Hole (ii) had deformed and the sites where the negative-electrode active material had not been sufficiently filled into the guide hole was confirmed as shown in FIG. 5B. Such sites were also confirmed where the shape of the negative-electrode active material layer had collapsed due to the shape deformation of the guide hole even the negative-electrode active material had been sufficiently filled into the guide hole.

It is understood from the above that bubble formation in the resist layer can be suppressed and the negative-electrode active material layer can be formed by way that the resist layer is once removed after forming the positive-electrode active material layer then the resist layer is freshly formed and the negative-electrode active material is filled into the guide hole formed in the resist layer.

Charge-Discharge Property

Example 4

The comb-shaped electrodes 11a and 11b shown in FIG. 3 were prepared similarly to Example 1 except that mass ratios of raw materials were changed from 87:6:5:2 to 81:12:5:2 when preparing the positive-electrode active material and the negative-electrode active material, and the entire size of comb-shaped electrodes, thickness of teeth, space between two adjacent teeth, length of teeth, number of teeth, and thickness of active material layers were set as shown in Table 1.

The space between the resulting comb-shaped electrodes 11a and 11b was filled with an electrolyte liquid A (1M $LiPF_6$ solution added with 5 mass % vinylene carbonate (solvent: mixture liquid of ethylene carbonate and diethyl carbonate of volume ratio 1:1) to thereby prepare secondary cells (Example 4) (sample number: 3).

Figure 6A:
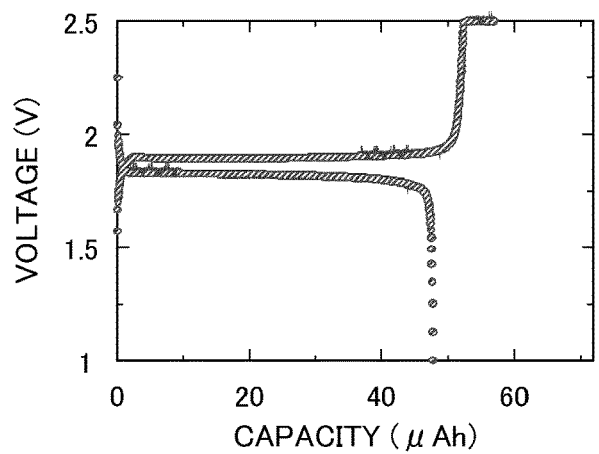
FIGS. 6A to 6C are graphs that show the results of measurement of charge-discharge curves using a comb-shaped electrode produced in accordance with an embodiment of the method for producing a comb-shaped electrode of the present invention.
Figure 6B:
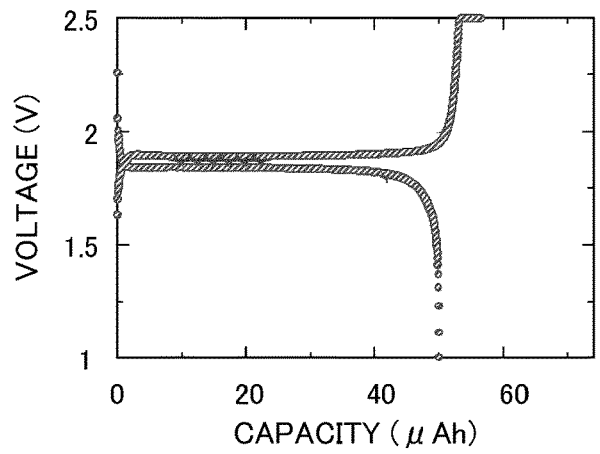
Figure 6C:
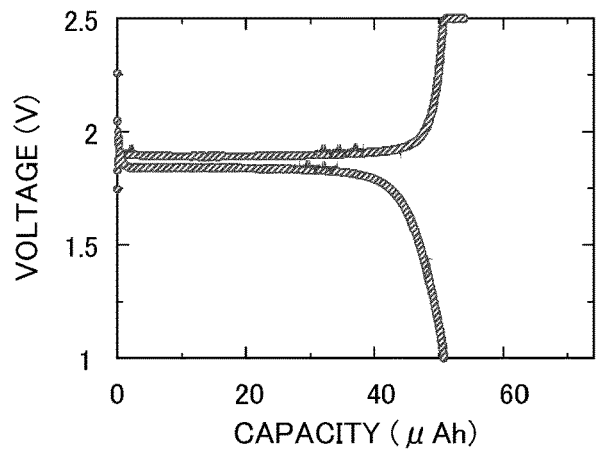

These secondary cells were charged and discharged with setting a current value to 50 μm. The charge-discharge curves are shown in FIGS. 6A to 6C. The capacities of the 3 samples were similar and thus repeatability could be confirmed. The value of discharged capacity read from the charge-discharge curves is also shown in Table 1.

What is claimed is:

1. A method for forming an electrode on a support, said electrode comprising n patterns, wherein n is an integer of at least 2, wherein each pattern is formed from identical or different pattern materials, the method comprising:

forming a first resist layer by coating a resist composition on a surface of the support;

with respect to each of a kth pattern material and a kth resist layer in order from k=1 to k=n−1 (k: an integer of 1 to n−1), conducting the following (i) to (iv):

(i) forming a guide hole through a kth resist layer by exposure and development, wherein the guide hole penetrates up to the surface of the support through the kth resist layer;

(ii) filling a kth pattern material into the guide hole by a screen printing process;

(iii) removing the kth resist layer; and (iv) forming a (k+1)th resist layer by coating a resist composition on the support and the 1st to kth pattern materials without removing the kth pattern material filled into the guide hole, forming a guide hole through the (k+1)th resist layer by exposure and development, wherein the guide hole penetrates to the surface of the support through the (k+1)th resist layer, wherein the development is conducted with the (k+1)th resist layer being present on the pattern materials of from the first to the kth;

filling a (k+1)th pattern material into the guide hole by a screen printing process; and removing the (k+1)th resist layer so as to obtain the electrode on the support, said electrode consisting of the 1st to the kth pattern materials and the nth pattern material; such that the 1st to (k+1)th resist layers are not present on the support.

2. The method according to claim 1, wherein, in the development, the (k+1)th resist layer present on the first to kth pattern materials prevents the first to kth pattern materials from being in contact with the developer and flowing out.

TABLE 1

| | Electrolyte Liquid | Entire Size of Comb-Shaped Electrodes (mm × mm) | Thickness of Teeth (μm) | Space between Teeth (μm) | Length of Teeth (mm) | Number of Teeth | Thickness of Active Material Layers (μm) | Discharged Capacity (μAh) |
|---|---|---|---|---|---|---|---|---|
| Example 4 | A | 10 × 10 | 20 | 40 | 9.96 | 40 | 20 | 50 |

It is understood from these results that the secondary cells with the comb-shaped electrode produced by the pattern forming method according to the present invention have a good charge-discharge property.

EXPLANATION OF REFERENCE NUMERALS

1: support
2: first resist layer
3a, 3b: guide hole
4a, 4b: pattern material layer
5: second resist layer
11a, 11b: comb-shaped electrode
12a, 12b: current collector
13a, 13b: active material layer
14: substrate 3. The method according to claim 1, wherein short circuit does not occur between the kth pattern material layer and the (k+1)th pattern material layer.

4. A method for producing a comb-shaped electrode, in which a positive electrode and a negative electrode are each formed into a comb shape and oppositely disposed so that parts of teeth of the comb shapes are alternately arranged, the method comprising:

forming a conductive layer on a surface of a substrate;

forming a current collector by patterning the conductive layer; and setting the current collector to a support and forming the positive electrode and the negative electrode on the support by the method according to claim 1.

5. A process of producing a secondary cell comprising a comb-shaped electrode, the process comprising forming the comb-shaped electrode by the method according to claim 4.

6. The method according to claim 1, wherein the electrode is a positive electrode.

7. The method according to claim 1, wherein the electrode is a negative electrode.

\* \* \* \* \*